United States Patent
Master et al.

[11] Patent Number: 6,103,549
[45] Date of Patent: Aug. 15, 2000

[54] NO CLEAN FLUX FOR FLIP CHIP ASSEMBLY

[75] Inventors: Raj N. Master, San Jose; Orion K. Starr, Santa Clara; Maria Guardado; Mohammad Zubair Khan, both of San Jose, all of Calif.

[73] Assignee: Advanced Micro Devices, Inc., Sunnyvale, Calif.

[21] Appl. No.: 09/040,643

[22] Filed: Mar. 17, 1998

[51] Int. Cl.⁷ .......................... H01L 21/44; H01L 21/48; H01L 21/50
[52] U.S. Cl. ............................. 438/106; 438/118
[58] Field of Search ...................... 438/108, 118

[56] References Cited

U.S. PATENT DOCUMENTS

| | | | |
|---|---|---|---|
| 5,647,123 | 7/1997 | Greenwood et al. | 29/840 |
| 5,872,051 | 2/1999 | Fallon et al. | |
| 5,953,814 | 9/1999 | Sozansky et al. | |

FOREIGN PATENT DOCUMENTS

| | | | |
|---|---|---|---|
| 0586243 | 9/1994 | European Pat. Off. | H01L 21/60 |
| 03 238195 | 10/1991 | Japan | B23K 35/363 |

OTHER PUBLICATIONS

XP–002107287, Sep. 2,1993, USA.

*Primary Examiner*—John F. Niebling
*Assistant Examiner*—Josetta Jones
*Attorney, Agent, or Firm*—H. Donald Nelson

[57] ABSTRACT

A method of assembling a substrate and die in a flip chip configuration using a no clean flux. The no clean fluxes have sufficient chemical activity to activate solder bumps contacting bond pads to form reliable solder joints, sufficient tackiness to hold the substrate and die in alignment with the solder bumps contacting the bond pads, and a viscosity to enable a high volume manufacturing process to be used. The no clean fluxes leave a minimal amount of residue during a reflow process that does not interfere with an underfill operation and does not adversely affect the solder joints. The no clean fluxes that can be used for this application are RM1919 from Alpha Metals, Co. and H208 from Indium Company.

6 Claims, 4 Drawing Sheets

NO CLEAN FLUX FOR FLIP CHIP ASSEMBLY

BACKGROUND OF THE INVENTION

1. Field of the Invention

This invention relates generally to a method of assembly of a semiconductor device assembled in a flip chip configuration. More specifically, this invention relates to the application of a flux that does not require a subsequent cleaning step in the assembly process for a flip chip configuration.

2. Discussion of the Related Art

The most important objective of semiconductor packaging is to support the original design objective and intent of the integrated circuit chips. In today's technological environment, there is an ever-increasing requirement to increase the integration of circuits onto a single semiconductor chip. At the same time there is a requirement to increase the performance of the semiconductor chip, whether it is a memory chip, a microprocessor chip, a telecommunications chip or any other type of semiconductor chip. As more and more circuit functions are added to a chip, the number of interconnections also increases dramatically. An overriding factor in the increase of integration and increase of performance is the requirement to reduce the cost of the final product.

An early flip chip method of packaging semiconductors was developed in the early 1960s by IBM® as a possible replacement for the expensive, unreliable, low-productivity, and manually operated face-up wire-bonding technology. However, because high-speed automatic wire bonders for the most part met the needs of the semiconductor industry there was not an aggressive development effort expended to improve the flip chip technology methods. Flip chip technology is defined as mounting the semiconductor chip to a substrate with any kind of interconnect materials and methods such as fluxless solder bumps, tape-automated bonding (TAB), wire interconnects, conductive polymers, anisotropic conductive adhesives, metallurgy bumps, compliant bumps, and pressure contacts as long as the active chip surface is facing the substrate.

As a direct result of the higher requirements of package density, performance, and interconnection; the limitations of face-up wire bonding technology; and the growing use of multichip module technology there is a need to improve the flip chip technology and to decrease the cost of the flip chip technology at the same time. The flip chip interconnects are being used in the semiconductor industry primarily because of their high I/O density capability, small profiles, and good electrical performance. Demands on performance, reliability, and cost have resulted in the development of a variety of flip chip technologies using solder, conductive epoxy, hard metal bump (such as gold) and anisotropic conductive epoxy interconnects. Among these materials, solders have remained a preferred choice as the material forming electrical connections in flip chip assemblies.

Solder flip chip interconnect systems consist of essentially three basic elements. These include the chip, the solder bump, and the substrate. The bumps are first deposited on a wafer and reflowed. The wafer is then diced into chips. The chips are flipped over, aligned to a substrate, tacked, and reflowed. An underfill may be used to improve the reliability of the interconnects. Each of these elements and the processes used to assemble them together affect the performance and the cost of the interconnect system. Therefore, the performance and cost must be compared on the basis of the interconnect system as a whole, and not merely on any single element of the interconnect assembly.

The materials and processes involved in the manufacture of the flip chip interconnect system determine its performance. The semiconductor device or the chip may be silicon or gallium arsenide. The bond pad metallization on the wafer can be Ni—Au, Cr—Cu—Au, TiW—Cu, Ti—Cu, or TiW—Au. If the bond pads are on the substrate the selection of the bond pad metallization material depends upon the substrate material. For example, if the substrate is a ceramic material, the bond pads are Ni—Cu and if the substrate is an organic material, the bond pads are Cu. The bump material can be one of a variety of Pb-based or Pb-free solders. The substrate can be silicon, alumina, glass, or one of a variety of organic substrates. The substrate metallization can be gold or copper. Underfills are used primarily to improve reliability of flip chip interconnect systems. These underfill materials fill the gap between the chip and substrate around the solder joints, reducing the thermal stresses imposed on the solder joint.

The process step used in the manufacture of the interconnect systems can be varied and include process technologies such as plating, evaporation, wire bumping, dispensing, and printing. The reflow process may be performed in air with flux or in a controlled ambient. Flip chip bonding processes include those based on the controlled-collapse chip connection (C4) approach or those in which the geometry of the bump is controlled by the bonding equipment.

The assembly of a typical flip chip interconnect system involves two overall tasks: (1) flip chip bonding and (2) encapsulation or underfill. During flip chip bonding, the bumped die is first aligned and attached to the bond pads on the substrate using a tacky flux. (It is noted that the bumps can be formed on the substrate or on both the substrate and die and that the bond pads can be formed on the die). Then the module is heated so that the solder melts and forms a metallurgical bond with the bond pad (the reflow process). Following the flip chip bonding process the flux residues are cleaned. The solvent materials necessary to clean the flux residues are typically highly flammable and/or hazardous materials and some may be carcinogenic. Because of these characteristics of the solvent materials, the cleaning step is very expensive because it requires highly specialized equipment. The equipment may have to be explosion proof, or it may have to have special filtering systems to protect the surrounding community as well as the technicians from air pollution and/or water pollution.

Therefore, what is needed is a method of assembling a semiconductor device in a flip chip configuration without having to perform the cleaning process to remove the flux residue from the device after the reflow process is completed.

SUMMARY OF THE INVENTION

According to the present invention, the foregoing and other objects and advantages are attained by a method of assembling a substrate and die in a flip chip configuration using a no clean flux. The no clean fluxes have a sufficient chemical activity to activate solder bumps contacting bond pads to form reliable solder joints, a sufficient tackiness to hold the substrate and die in alignment with the solder bumps contacting the bond pads, and a viscosity to enable a high volume manufacturing process to be used. The no clean fluxes leave a minimal amount of residue during a reflow process that does not interfere with an underfill operation and does not adversely affect the solder joints. The no clean fluxes that can be used for this application are RM1919 from Alpha Metals Co. and H208 from Indium Corporation.

In one aspect of this invention, bond pads are formed on the substrate and solder bumps are formed on the die. The no clean flux is applied to the bond pads formed on the substrate. The bond pads on the substrate and the solder bumps on the die are aligned and subjected to a reflow process.

In another aspect of this invention, the gap between the die and substrate is filled with an underfill material.

The method of the invention using a no clean flux avoids the use of a time consuming and costly cleaning process.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 3A–3F show views of the substrate/die during the process steps of assembling the substrate/die module in the prior art, wherein;

FIG. 3A shows a substrate with bond pads formed on the top surface;

FIG. 3B shows the substrate with bond pads shown in FIG. 3A with a prior art flux shown covering the bond pads;

FIG. 3C shows the substrate with bond pads shown in FIG. 3B with a die with bumps aligned with the substrate ready for a reflow process;

FIG. 3D shows the substrate/die module after the reflow process showing flux residue between the substrate and die;

FIG. 3E shows the substrate/die module during the cleaning process for removing the flux residue from between the substrate and die;

FIG. 3F shows the substrate/die module with an underfill between the substrate and die;

FIGS. 4A–4E show views of the substrate/die during the process steps of assembling the substrate/die module in accordance with the present invention, wherein;

FIG. 4A shows a substrate with bond pads formed on the top surface;

FIG. 4B shows the substrate with bond pads shown in FIG. 4A with a flux in accordance with the present invention shown covering the bond pads;

FIG. 4C shows the substrate with bond pads shown in FIG. 4B with a die with bumps aligned with the substrate ready for a reflow process;

FIG. 4D shows the substrate/die module after the reflow process showing a smaller amount of flux residue between the substrate and die; and FIG. 4E shows the substrate/die module with an underfill between the substrate and die.

DETAILED DESCRIPTION

Reference is now made in detail to specific embodiments of the present invention which illustrate the best mode presently contemplated by the inventors for practicing the invention.

Figure 1:
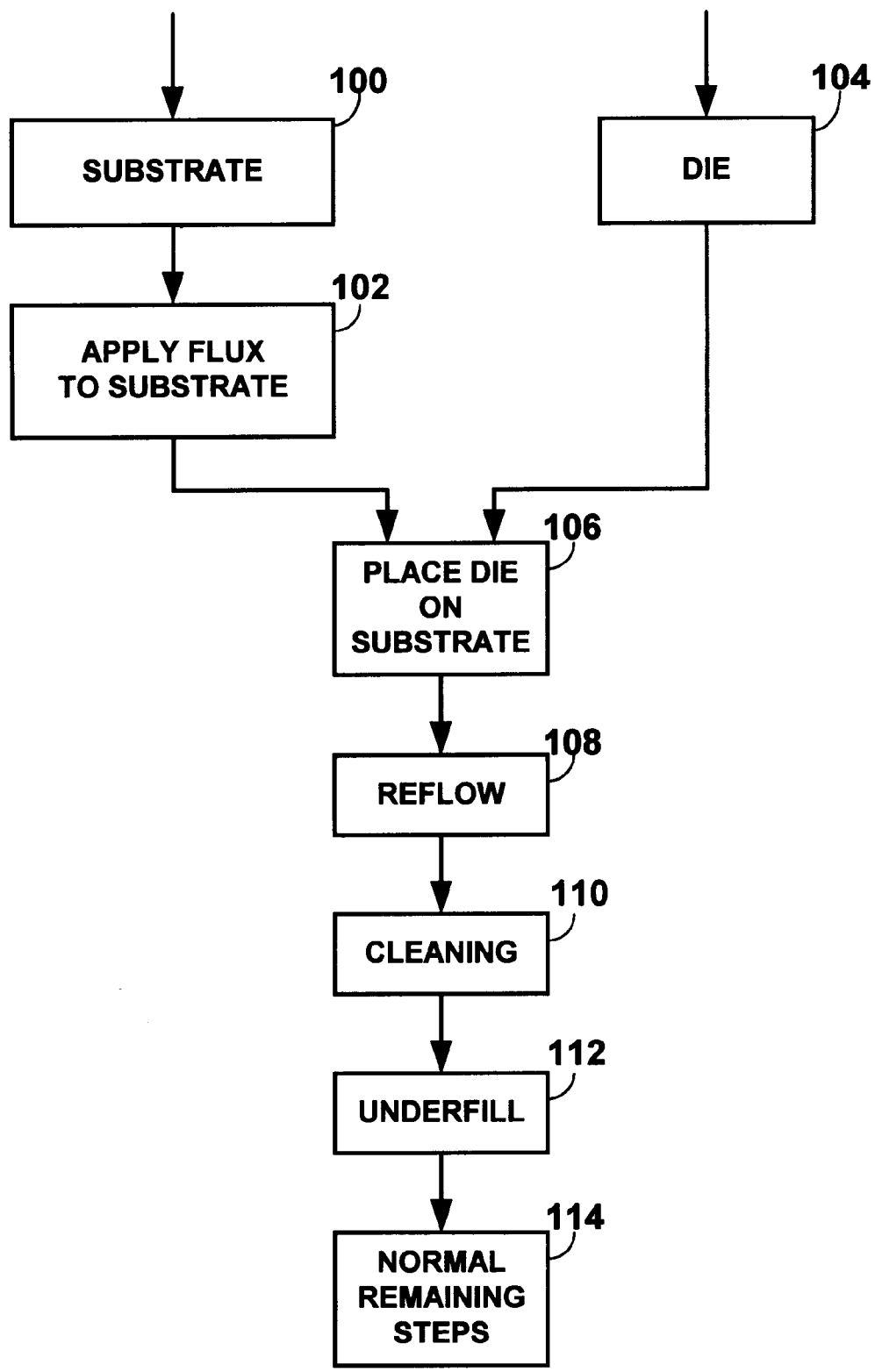
FIG. 1 is a flow diagram showing a prior art method of assembling a substrate and die in a flip chip configuration.

FIG. 1 is a flow diagram showing a prior art method of assembling a chip and a substrate in a flip chip configuration. FIG. 1 shows a substrate, indicated at 100 that has been formed by standard methods in the semiconductor manufacturing art. The substrate could be silicon, alumina (ceramic), glass, or one of a variety of organic substrates. Bond pads or solder bumps are formed on the substrate. Flux is applied to the substrate and bond pads or solder bumps as indicated at 102 by either manually brushing or spraying the flux onto the appropriate portion of the substrate. The die, indicated at 104 is a normal die and can be made on a silicon substrate or a gallium arsenide substrate. Bond pads or solder bumps are formed on the die and correspond to the bond pads or solder bumps formed on the substrate as discussed above. The bump material can be a variety of Pb-based or Pb-free solders. The bond pad metallization of the wafer can be Ni—Au, Cr—Cu—Au, TiW—Cu, Ti—Cu, or TiW—Au. The die is placed on the substrate in a flip chip configuration as indicated at 106. A flip chip configuration is one in which the active surface area is placed "face-down" onto the substrate. The substrate/chip combination is then heated to cause the solder to reflow as indicated at 108. The substrate/chip combination is cleaned as indicated at 110, and underfill is applied between the substrate and die as indicated at 112 and subjected to normal manufacturing steps as indicated at 114.

Figure 2:
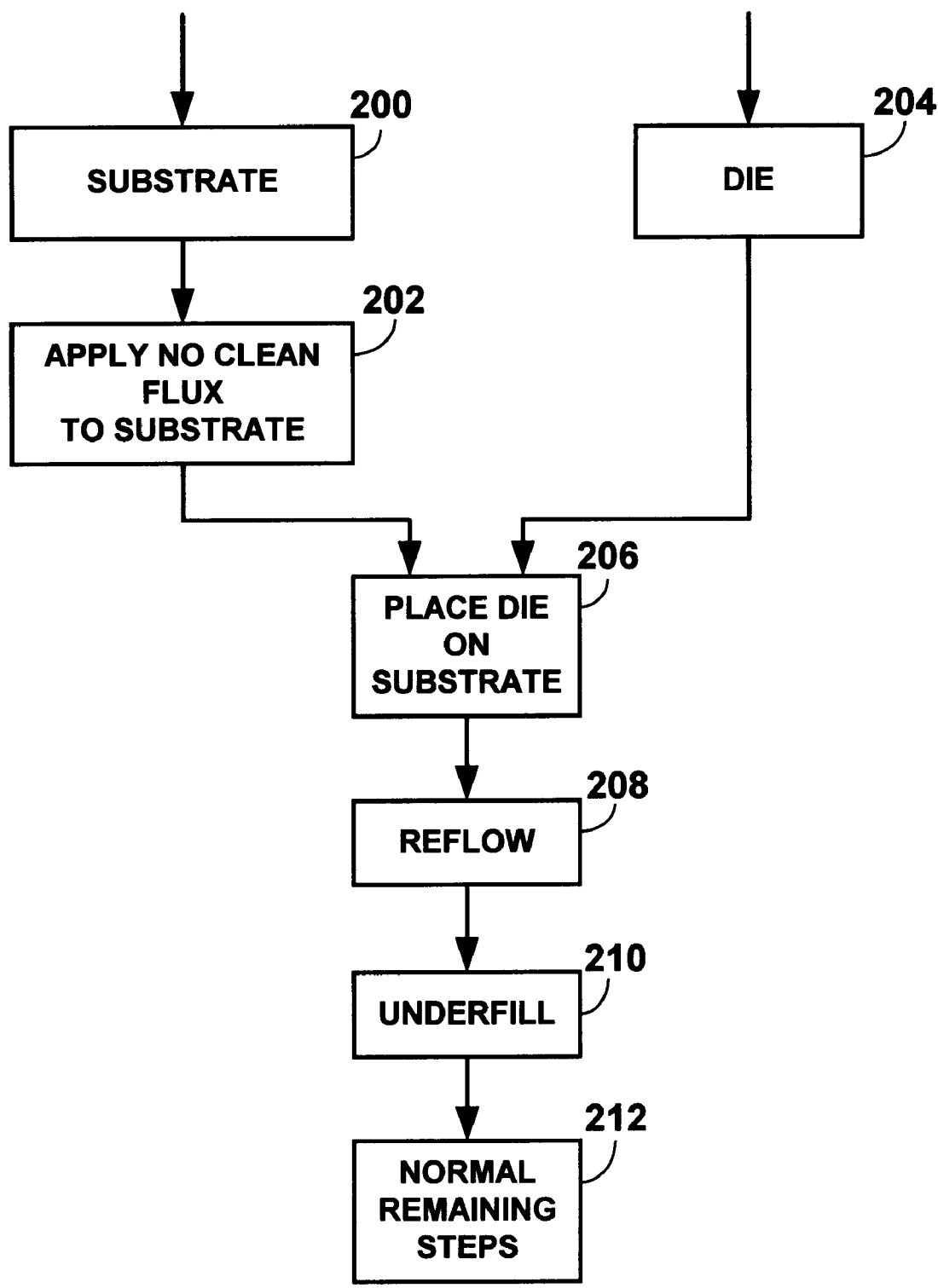
FIG. 2 is a flow diagram showing a method of assembling a substrate and die in a flip chip configuration using a no clean flux in according to the present invention.

FIG. 2 is a flow diagram showing the method of assembling a chip and a substrate in a flip chip configuration in accordance with the present invention. FIG. 2 shows a substrate, indicated at 200 that has been formed by standard methods in the semiconductor manufacturing art. As noted above, the substrate could be silicon, alumina (ceramic), glass, or one of a variety of organic substrates. Bond pads or solder bumps are formed on the substrate. A no clean flux in accordance with the present invention is applied to the substrate and bond pads or solder bumps as indicated at 202 by either brushing or spraying the flux onto the appropriate portion of the substrate. The die indicated at 204 is a normal die and can be made on a silicon substrate or a gallium arsenide substrate. Bond pads or solder bumps are formed on the die and correspond to the bond pads or solder bumps formed on the substrate as discussed above. The bump material can be a variety of Pb-based or Pb-free solders. The bond pad metallization of the wafer can be Ni—Au, Cr—Cu—Au, TiW—Cu, Ti—Cu, or TiW—Au. The die is placed on the substrate in a flip chip configuration as indicated at 206 forming a substrate/die module. The substrate/die module is subjected to a reflow process as indicated at 208 and an underfill material is applied between the substrate and die as indicated at 210. The substrate/die module is then subjected to normal manufacturing steps as indicated at 212.

Figure 3C:
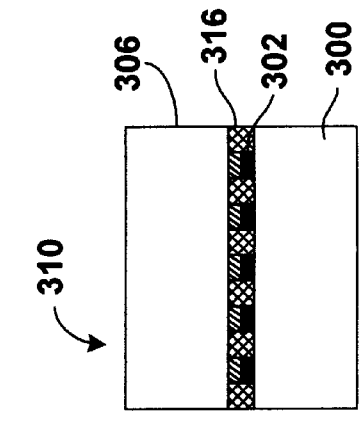
Figure 3F:
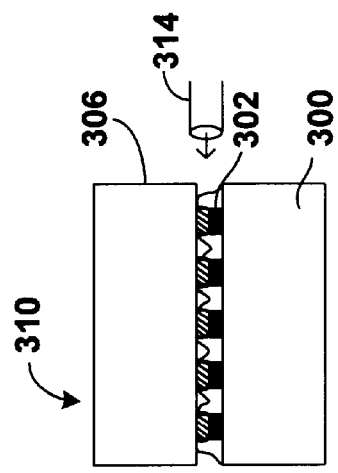
Figure 3B:
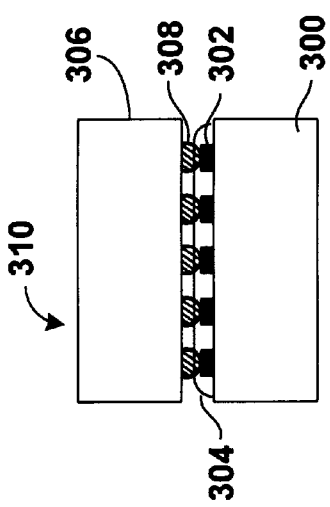
Figure 3E:
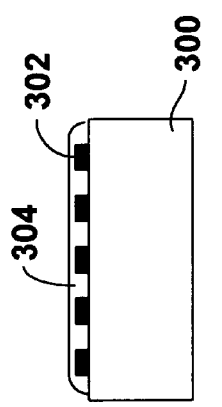
Figure 3A:
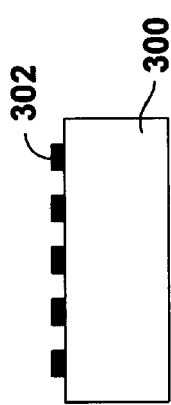

FIGS. 3A–3F show views of the substrate, die, and substrate/die module during the process steps of assembling the substrate/die module in the prior art. FIG. 3A shows a substrate 300 with bond pads, one of which is indicated at 302 formed on the substrate 300. As noted above, the substrate could be silicon, alumina (ceramic), glass, or one of a variety of organic substrates. The bond pad metallization of the wafer can be Ni—Au, Cr—Cu—Au, TiW—Cu, Ti—Cu, or TiW—Au. The selection of the bond pad material is partially dependent upon the material of the substrate. For example, if the substrate is a ceramic material, the bond pad material is Ni—Au and if the substrate is an organic material, the bond pad material is Cu/Au or Cu/Au coated with solder.

FIG. 3B shows a flux 304 having been applied to the substrate 300. One of the main purposes of the flux 304 is to provide a tacky surface to hold the die (to be discussed) to the substrate 300 during the reflow process (to be discussed). Fluxes commonly contain three constituents: a solvent (e.g., alcohol), a vehicle (e.g., a high-boiling-point solvent such as aliphatic alcohol), and an activator (e.g., carboxylic acids). The solvent facilitates uniform spreading of the flux 304 on the bond pads. The reflow process (to be discussed) usually consists of a preheat step where the solvent is vaporized. This promotes a uniform coating of the flux 304 on the solder and bond pad metallization. Further increase in temperature causes the vehicle to flow along with the activator. The activator reduces the oxides, while both the vehicle and activator volatilize.

FIG. 3C shows a die 306 with bumps, one of which is indicated at 308, formed on the active surface of the die 306. The die 306 is placed face down on the substrate in a flip chip configuration forming a substrate/die module 310. As discussed above, the tackiness of the flux 304 holds the die 306 is proper alignment with the substrate 300 so that the bond pads 302 and the solder bumps 308 are properly aligned. The substrate/die module 310 is ready for the reflow step. During the reflow process the solder bumps 308 are heated to a temperature above the melting point of the solder. When the solder melts, it forms a metallurgical bond with the bond pads 302.

Figure 3D:
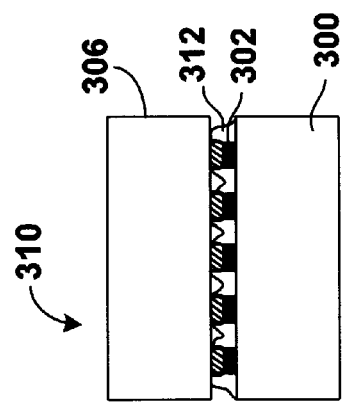

FIG. 3D shows the substrate/die module 310 after the reflow process has been completed. Flux residue areas, one of which is indicated at 312, remain between the substrate 300 and the die 306. The flux residue areas 312 commonly contain residues from the carrier, the wetting agent, and reaction by-products of the reduction reaction. The flux residue areas 312 as shown can interfere with the flow of underfill material (to be discussed below).

FIG. 3E shows the substrate/die module 310 being subjected to a cleaning process, indicated to 314 in which a solvent material is utilized to remove the flux residue areas 312. The solvent materials necessary to clean the flux residues are typically highly flammable and/or environmentally hazardous and some may be carcinogenic. Because of these characteristics of the solvent materials, the cleaning step is very expensive because the cleaning step requires highly specialized equipment. The equipment may have to be explosion proof and it may have to have special filtering systems to protect the environment.

FIG. 3F shows the substrate/die module 310 with an underfill material 316 applied in the gap between the substrate 300 and die 306. The underfill material is typically an epoxy. The underfill provides two functions. The first function of the underfill material is to protect the chip and interconnects during subsequent processes. The second function of the underfill is to improve the reliability of the interconnect system.

Figure 4C:
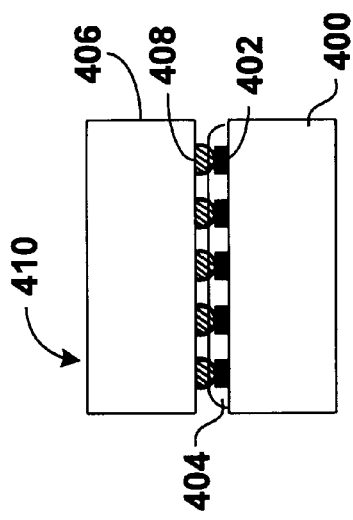
Figure 4B:
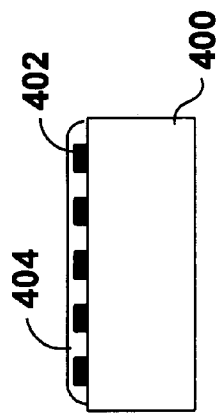
Figure 4E:
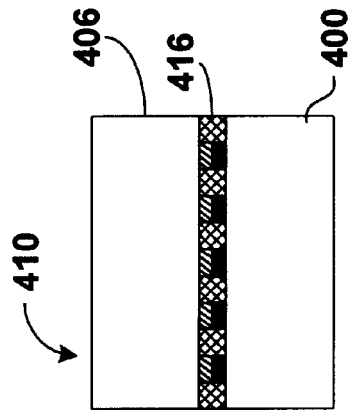
Figure 4A:
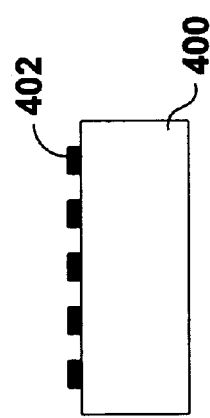

FIGS. 4A–4E show views of the substrate, die, and substrate/die module during the process steps of assembling the substrate/die module in accordance with the present invention. FIG. 4A shows a substrate 400 with bond pads, one of which is indicated at 402 formed on the substrate 400. As noted above, the substrate could be silicon, alumina (ceramic), glass, or one of a variety of organic substrates. The bond pad metallization of the wafer can be Ni—Au, Cr—Cu—Au, TiW—Cu, Ti—Cu, or TiW—Au. The selection of the bond pad material is partially dependent upon the material of the substrate. For example, if the substrate is a ceramic material, the bond pad material is Ni—Au and if the substrate is an organic material, the bond pad material is Cu.

FIG. 4B shows a no clean flux 404 having been applied to the substrate 400. One of the main purposes of the flux 404 is to provide a tacky surface to hold the die (to be discussed) to the substrate 400 during the reflow process (to be discussed). Fluxes commonly contain three constituents: a solvent (e.g., alcohol), a vehicle (e.g., a high-boiling-point solvent such as aliphatic alcohol), and an activator (e.g., carboxylic acids). The solvent facilitates uniform spreading of the flux 404 on the bond pads. The reflow process (to be discussed) usually consists of a preheat step in which the solvent is vaporized. This promotes a uniform coating of the flux 404 on the solder and bond pad metallization. A further increase in temperature causes the vehicle to flow along with the activator. The activator reduces the oxides, while both the vehicle and activator volatilize. The no clean flux 404 is either RM1919 available from Alpha Metals Corporation or H208 available from Indium Corporation. The fluxes were developed to meet the following criteria:

1. Sufficient activity to be used in the flip chip method. The flux must have sufficient activity to activate the Ni—Au, Cu or soldered bond pads on the substrate as well as being able to break or reduce the surface tension at the interface to effect good wetting between the bumps and the bond pads.
2. Low residue so that the residue does not interfere with the application of the underfill.
3. Residue does not adversely affect the integrity of the solder joint.
4. Compatible with a variety of underfills. The selected fluxes have been shown to be compatible with EPX materials made by Polysciences Co. and Dexter/Hysol Co. materials, or Alpha Metals.
5. Have viscosity and rheology characteristics such that the flux can be applied using a brush dispensing method.
6. Have a robust process capability for high volume manufacturing.
7. Independent of die size.
8. Can be used with high temperature Pb/Sn solder as well as low temperature solders.

FIG. 4C shows a die 406 with bumps, one of which is indicated at 408, formed on the active surface of the die 406. The die 406 is placed face down on the substrate in a flip chip configuration forming a substrate/die module 410. As discussed above, the tackiness of the flux 404 holds the die 406 is proper alignment with the substrate 400 so that the bond pads 402 and the solder bumps 408 are properly aligned. The substrate/die module 410 is ready for the reflow step. During the reflow process the solder bumps 408 are heated to a temperature above the melting point of the solder. When the solder melts, it forms a metallurgical bond with the bond pads 402.

Figure 4D:
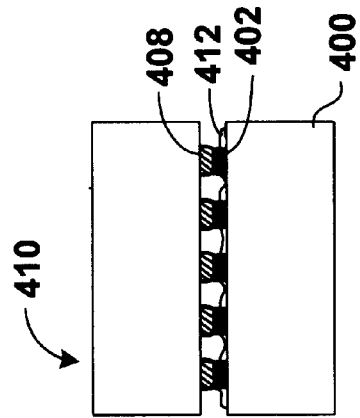

FIG. 4D shows the substrate/die module 410 after the reflow process has been completed. Flux residue areas, one of which is indicated at 412, remain between the substrate 400 and the die 406. The flux residue areas 412 commonly contain residues from the carrier, the wetting agent, and reaction by-products of the reduction reaction. The flux residue areas 412 as shown are much smaller than in prior art systems and are less likely to interfere with the flow of the underfill material to be applied in the next step.

FIG. 4D shows the substrate/die module 410 with an underfill material 416 applied in the gap between the substrate 400 and die 406. The underfill material is typically an epoxy. The underfill provides two functions. The first function of the underfill material is to protect the chip and interconnects during subsequent processes. The second function of the underfill is to improve the reliability of the interconnect system.

In summary, the results and advantages of the method of assembly of a semiconductor device assembled in a flip chip configuration using a no clean flux in accordance with the present invention can now be more fully realized. The application of a flux that does not require a subsequent cleaning step in the assembly process saves costly manufacturing time.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of assembling a substrate and die in a flip chip configuration, the method comprising:

forming bond pads on the substrate;

forming solder bumps on the die;

applying a no clean flux to the die having a sufficient chemical activity to activate the solder bumps contacting the bond pads to form reliable solder joints;

aligning the substrate and die with the solder bumps contacting the bond pads forming a substrate/die module; and subjecting the substrate/die module to a reflow process.

2. The method of claim 1 wherein applying a no clean flux further includes applying a no clean flux having a sufficient tackiness to hold the substrate and die in alignment with the solder bumps contacting the bond pads.

3. The method of claim 2 wherein applying a no clean flux further includes applying a no clean flux having a viscosity to enable a high volume manufacturing process to be used.

4. The method of claim 3 wherein applying a no clean flux further includes applying a no clean flux that leaves a minimal amount of residue during the reflow process that does not interfere with an underfill operation and does not adversely affect the solder joints.

5. The method of claim 4 wherein applying a no clean flux includes selecting a no clean flux from the group consisting of RM1919 and H208.

6. The method of claim 5 further comprising applying an underfill material between the substrate and the die.

* * * * *